(12) United States Patent
Yamada

(10) Patent No.: US 12,374,567 B2
(45) Date of Patent: Jul. 29, 2025

(54) SEMICONDUCTOR MANUFACTURING APPARATUS AND SEMICONDUCTOR MANUFACTURING METHOD

(71) Applicant: Hitachi High-Tech Corporation, Tokyo (JP)

(72) Inventor: Masaki Yamada, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 774 days.

(21) Appl. No.: 17/438,573

(22) PCT Filed: Sep. 29, 2020

(86) PCT No.: PCT/JP2020/036949
§ 371 (c)(1),
(2) Date: Sep. 13, 2021

(87) PCT Pub. No.: WO2022/070264
PCT Pub. Date: Apr. 7, 2022

(65) Prior Publication Data
US 2022/0310418 A1    Sep. 29, 2022

(51) Int. Cl.
*H01L 21/67* (2006.01)
*H01L 21/02* (2006.01)
*H01L 21/311* (2006.01)

(52) U.S. Cl.
CPC .. *H01L 21/67069* (2013.01); *H01L 21/02164* (2013.01); *H01L 21/31116* (2013.01); *H01L 21/67* (2013.01)

(58) Field of Classification Search
None
See application file for complete search history.

(56) References Cited

U.S. PATENT DOCUMENTS

| 7,141,504 B1 * | 11/2006 | Bhardwaj | C07C 17/00 438/719 |
| 2006/0037701 A1 * | 2/2006 | Koshiishi | H01L 21/31144 257/E21.252 |

(Continued)

FOREIGN PATENT DOCUMENTS

| JP | 2002521814 A | 7/2002 |
| JP | 2005161493 A | 6/2005 |

(Continued)

OTHER PUBLICATIONS

Office Action mailed Dec. 7, 2022 in Taiwanese Application No. 110128484.

(Continued)

*Primary Examiner* — Stephanie P Duclair
(74) *Attorney, Agent, or Firm* — Miles & Stockbridge, P.C.

(57) ABSTRACT

Provided is an etching apparatus or an etching method which improves a processing yield in etching a film formed of $SiO_2$. As means therefor, a semiconductor manufacturing apparatus, which includes an introduction port through which a processing gas containing respective vapors of hydrogen fluoride and an alcohol is introduced into a processing chamber inside a processing vessel, a sample table which is arranged in the processing chamber and on which a wafer to be processed is placed on an upper surface thereof, and an electrode which is arranged inside the sample table, and, when etching a first film formed on the upper surface of the wafer, configured to apply DC power that forms an electric field on a first layer formed on the upper surface of the wafer by the processing gas, is used.

4 Claims, 10 Drawing Sheets

(56) References Cited

U.S. PATENT DOCUMENTS

| | | | |
|---|---|---|---|
| 2006/0291132 A1* | 12/2006 | Kanno | H01L 21/6831 361/234 |
| 2010/0167461 A1 | 7/2010 | Rana et al. | |
| 2017/0169997 A1* | 6/2017 | Moriguchi | H01J 37/32715 |
| 2021/0207283 A1 | 7/2021 | Muranaka et al. | |

FOREIGN PATENT DOCUMENTS

| | | | |
|---|---|---|---|
| JP | 2006270017 A | | 10/2006 |
| JP | 2012514337 A | | 6/2012 |
| JP | 2016031955 A | | 3/2016 |
| TW | I595557 B | | 8/2017 |
| TW | 201926460 A | | 7/2019 |
| TW | 202020237 A | | 6/2020 |
| WO | 2015129719 A1 | | 9/2015 |
| WO | WO 2019108366 | * | 6/2019 |

OTHER PUBLICATIONS

Office Action mailed Nov. 30, 2021 in Taiwanese Application No. 110128484.
Chun Su Lee et al. "Modeling and Characterization of Gas-Phase Etching of Thermal Oxide and TEOS Oxide Using Anthdrous HF and CH3OH", J. Electrochem. Soc., Mar. 1996, vol. 143, No. 3 pp. 1099-1103.
Search Report mailed Oct. 27, 2020 in International Application No. PCT/JP2020/036949.
Written Opinion mailed Oct. 27, 2020 in International Application No. PCT/JP2020/036949.

* cited by examiner

[FIG. 1]
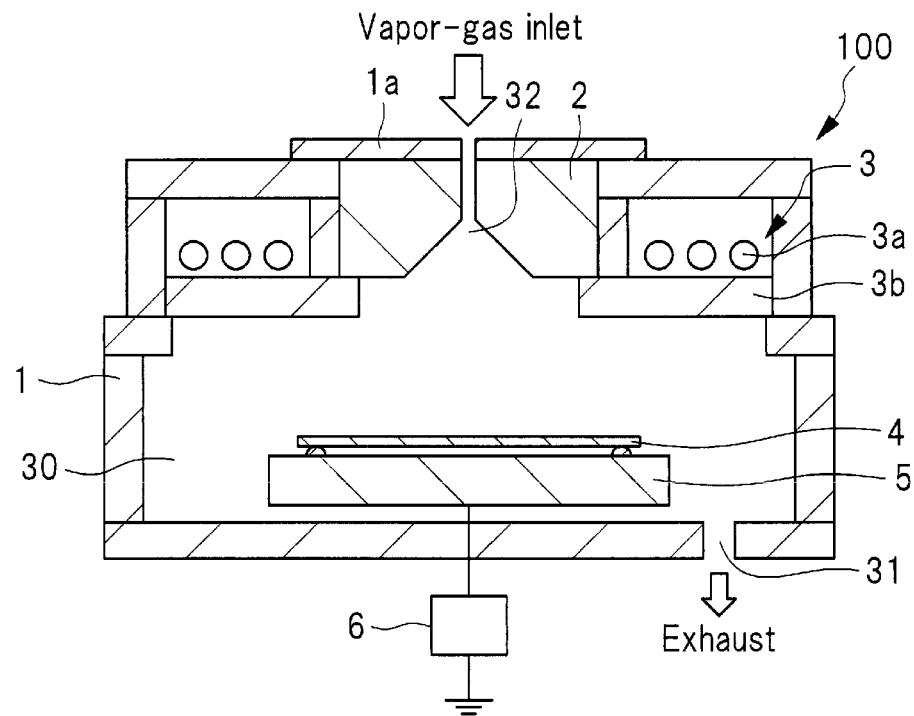
[FIG. 2]
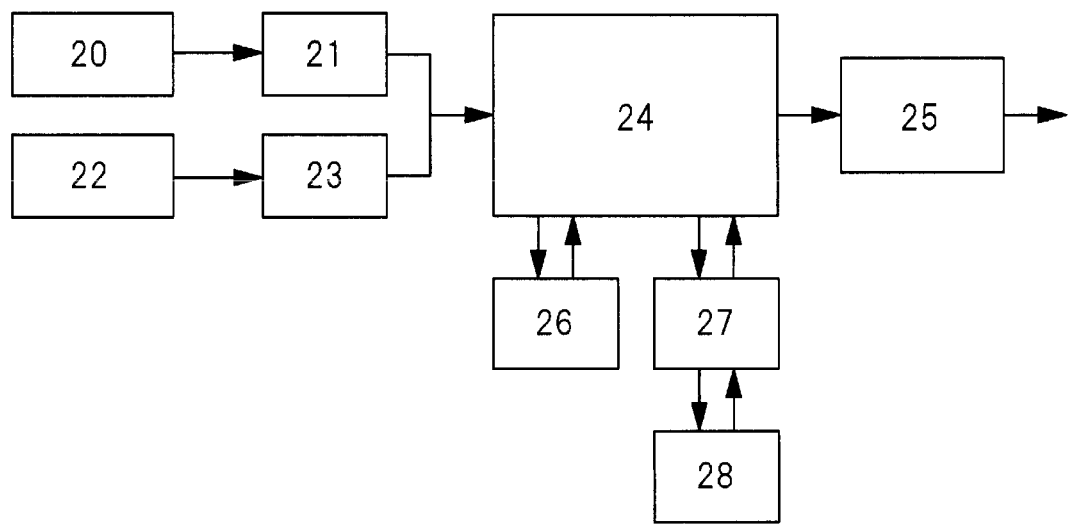

[FIG. 3]
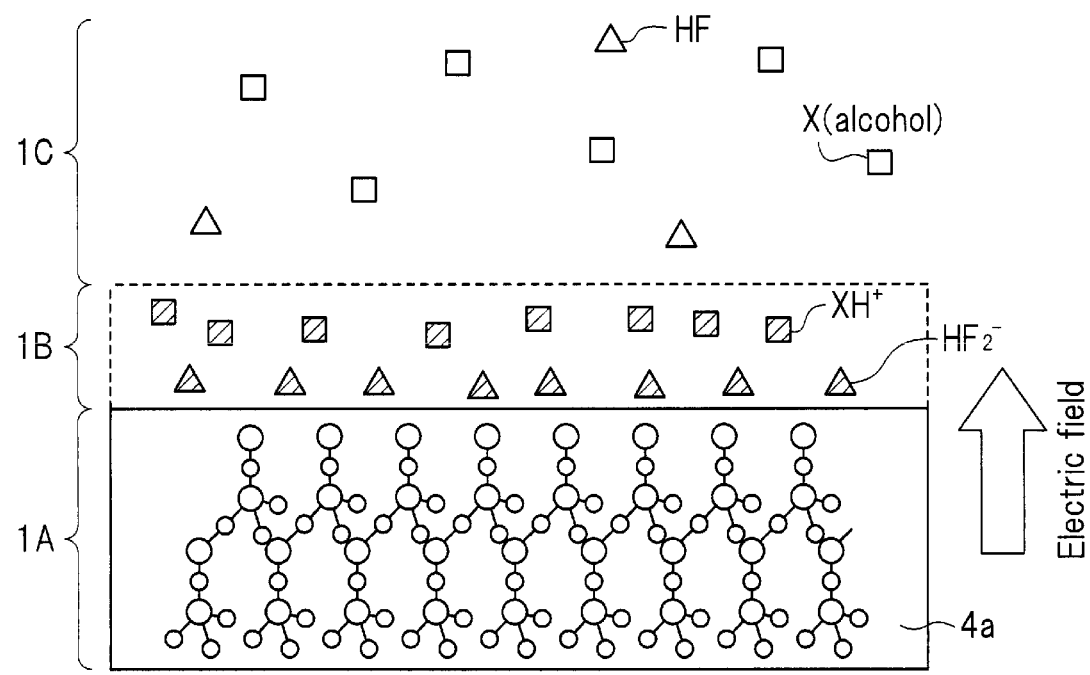

[FIG. 4]
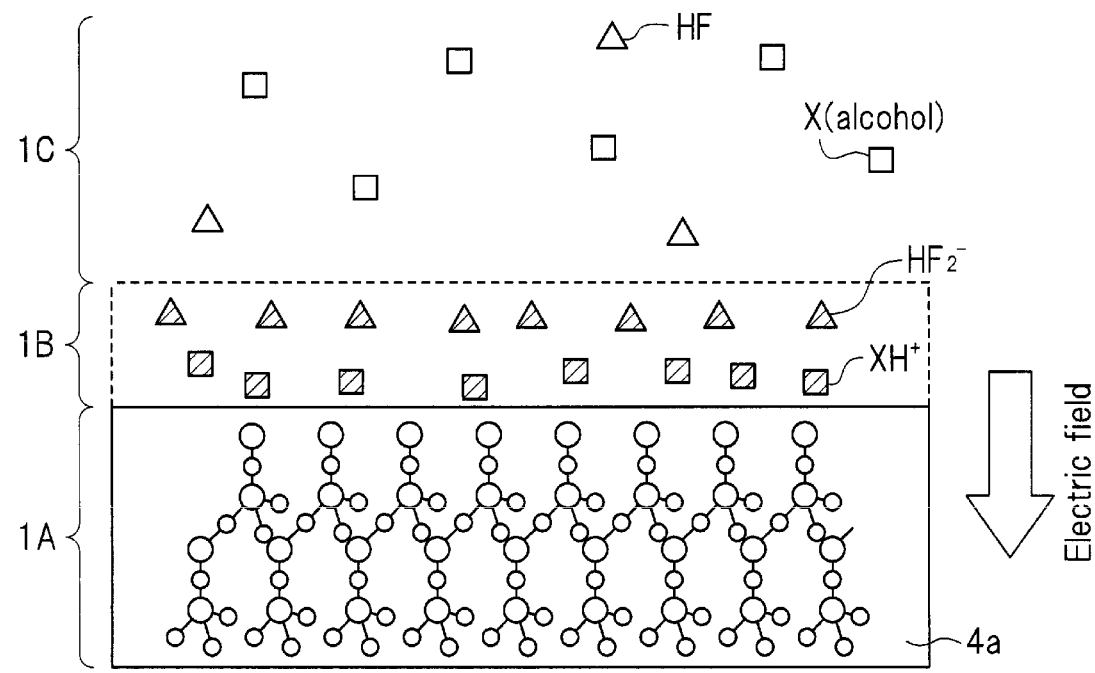
[FIG. 5]
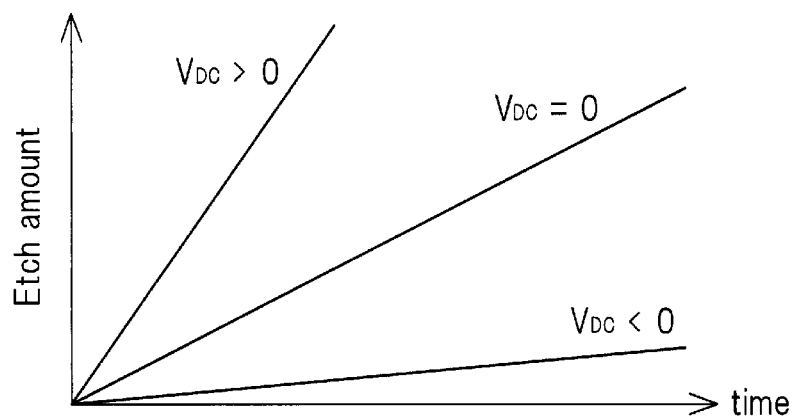

[FIG. 6]
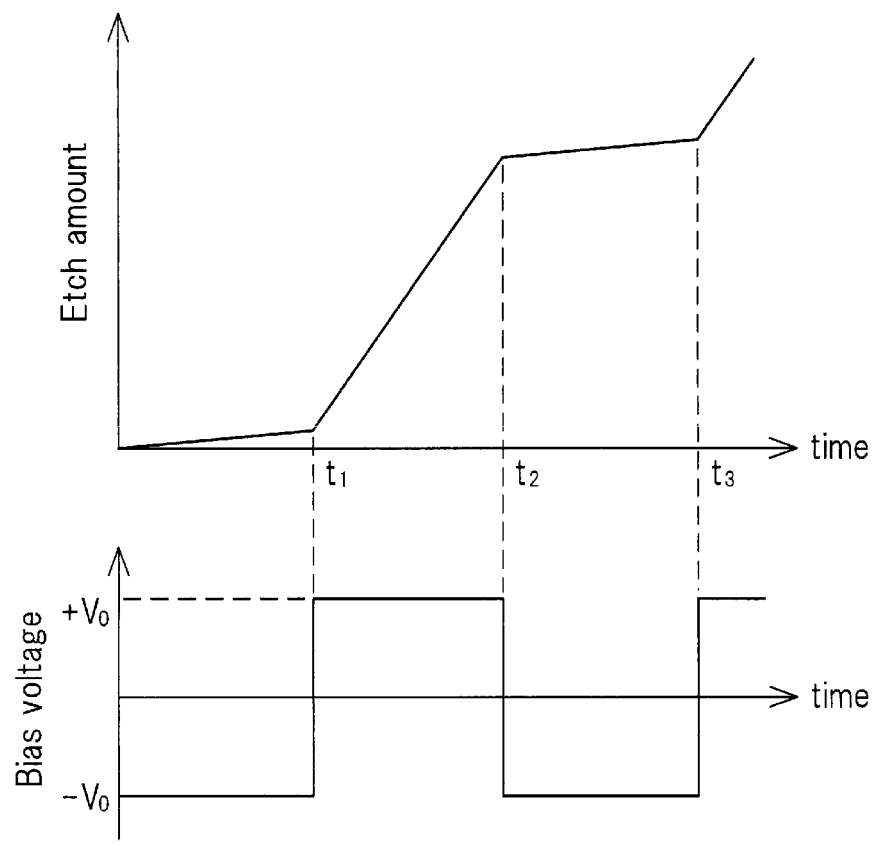

[FIG. 7]
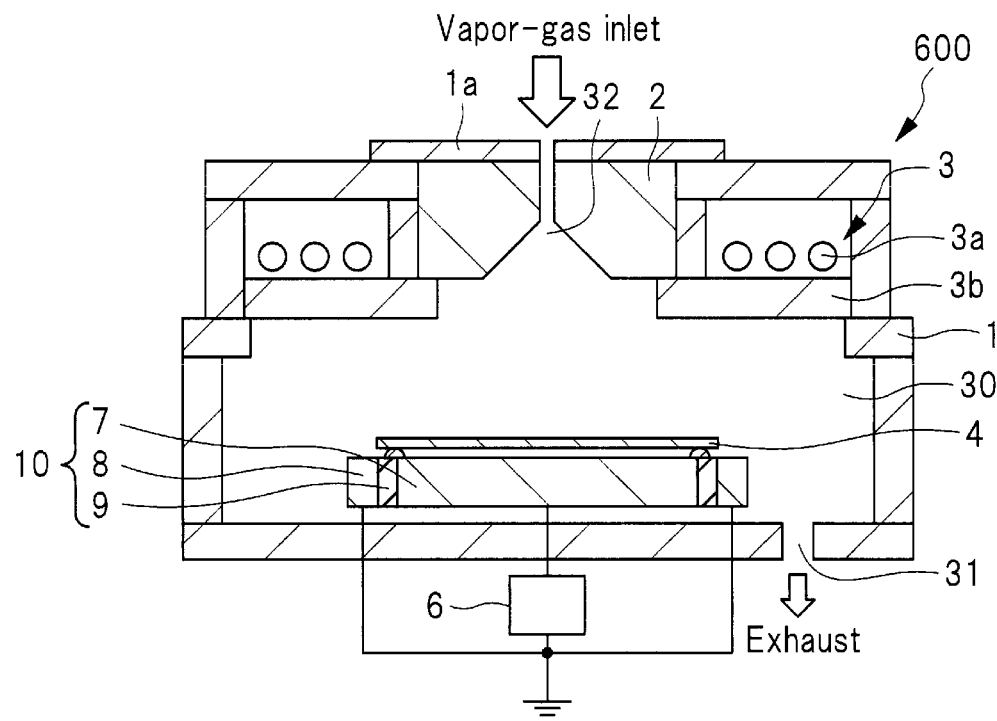
[FIG. 8]
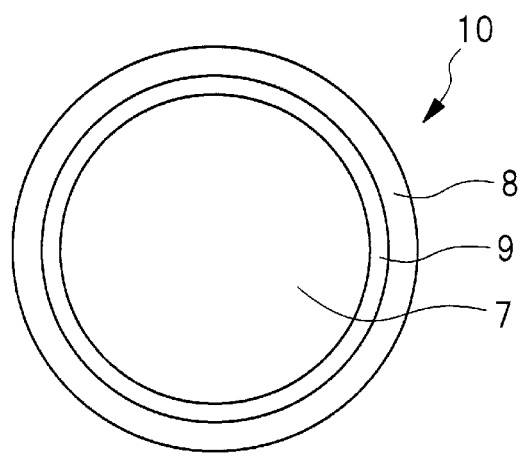

[FIG. 9]
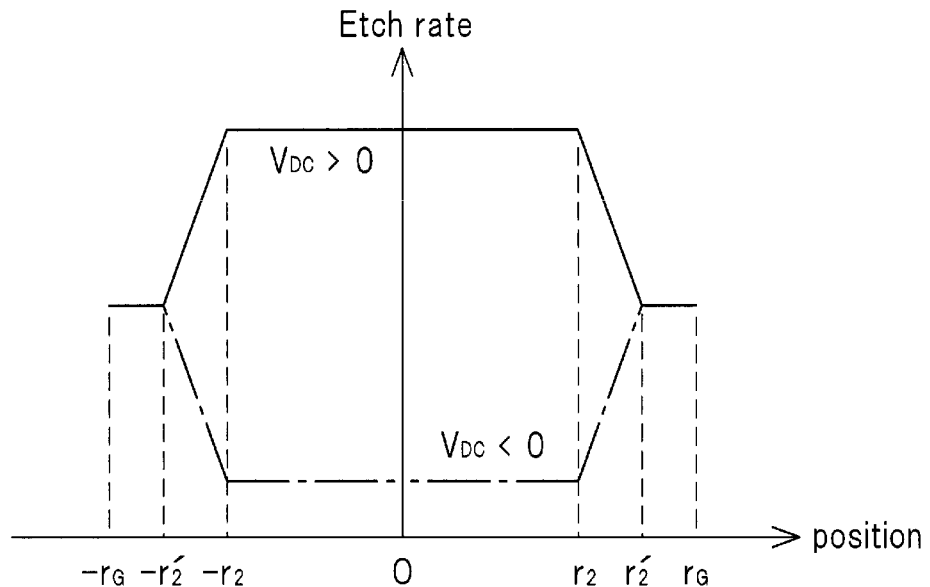
[FIG. 10]
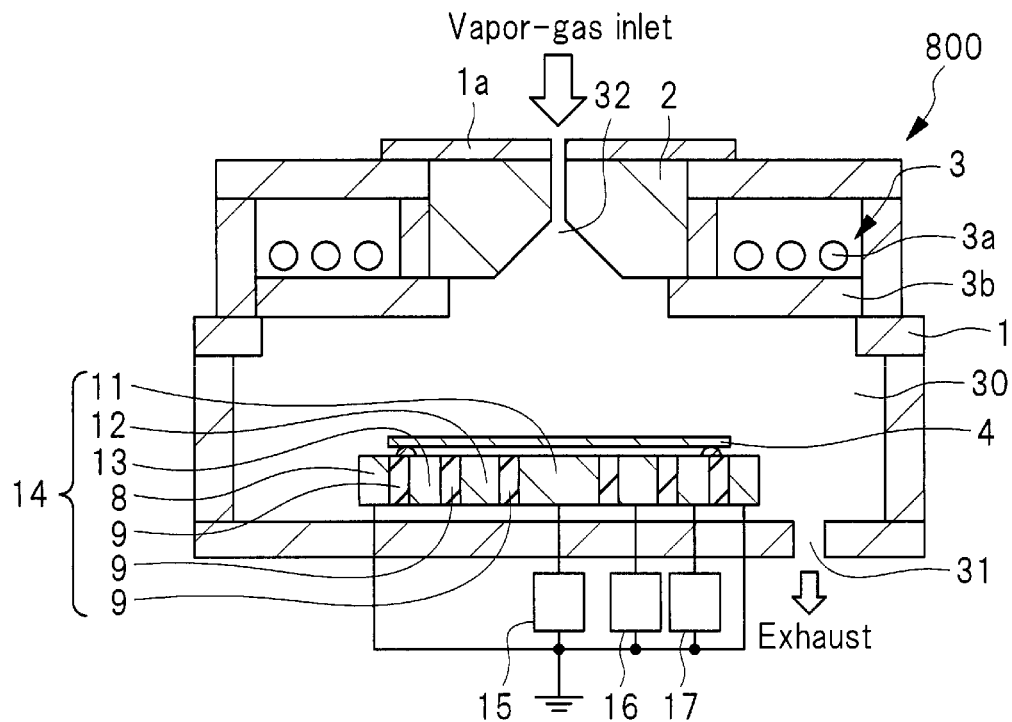

[FIG. 11]
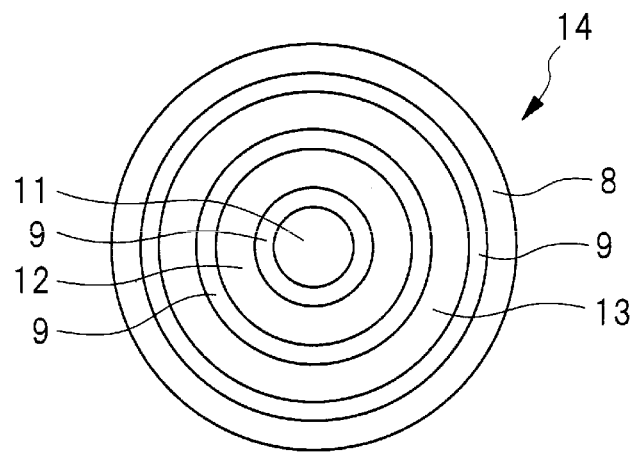
[FIG. 12]
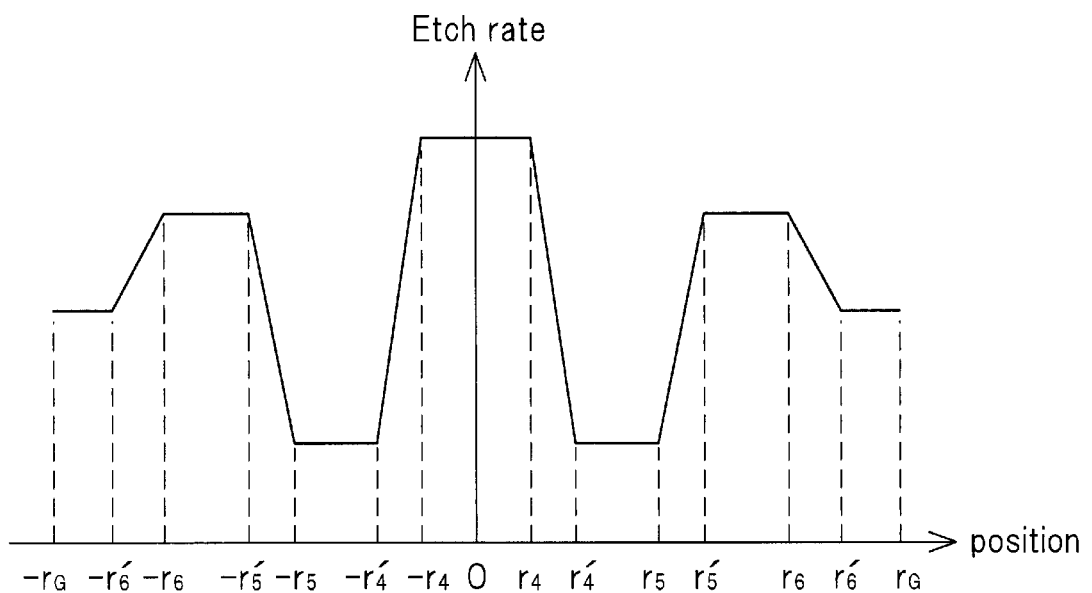

[FIG. 13]
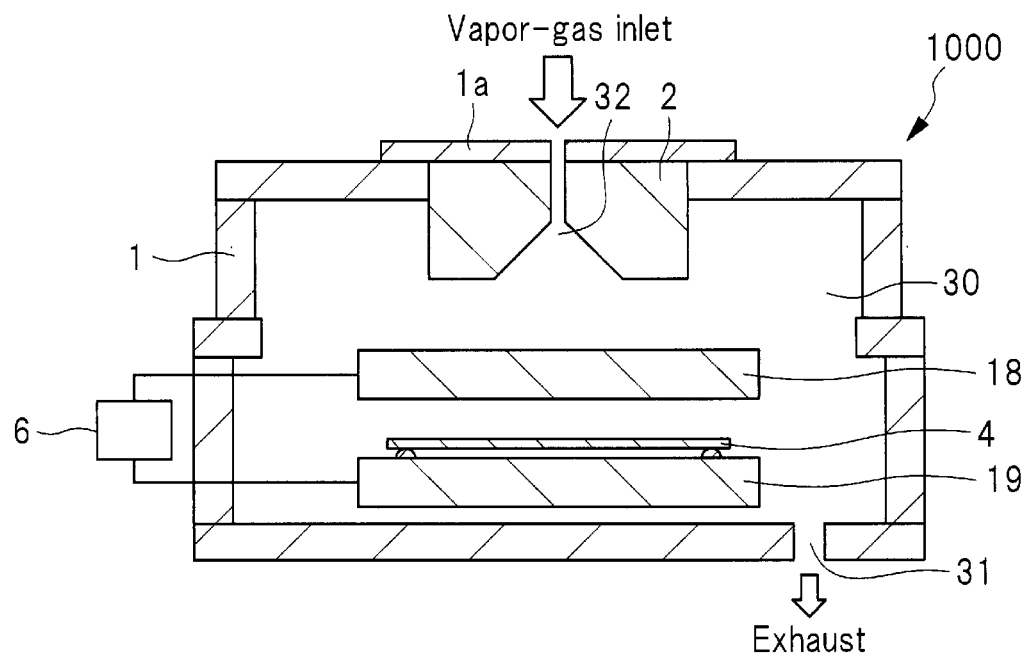

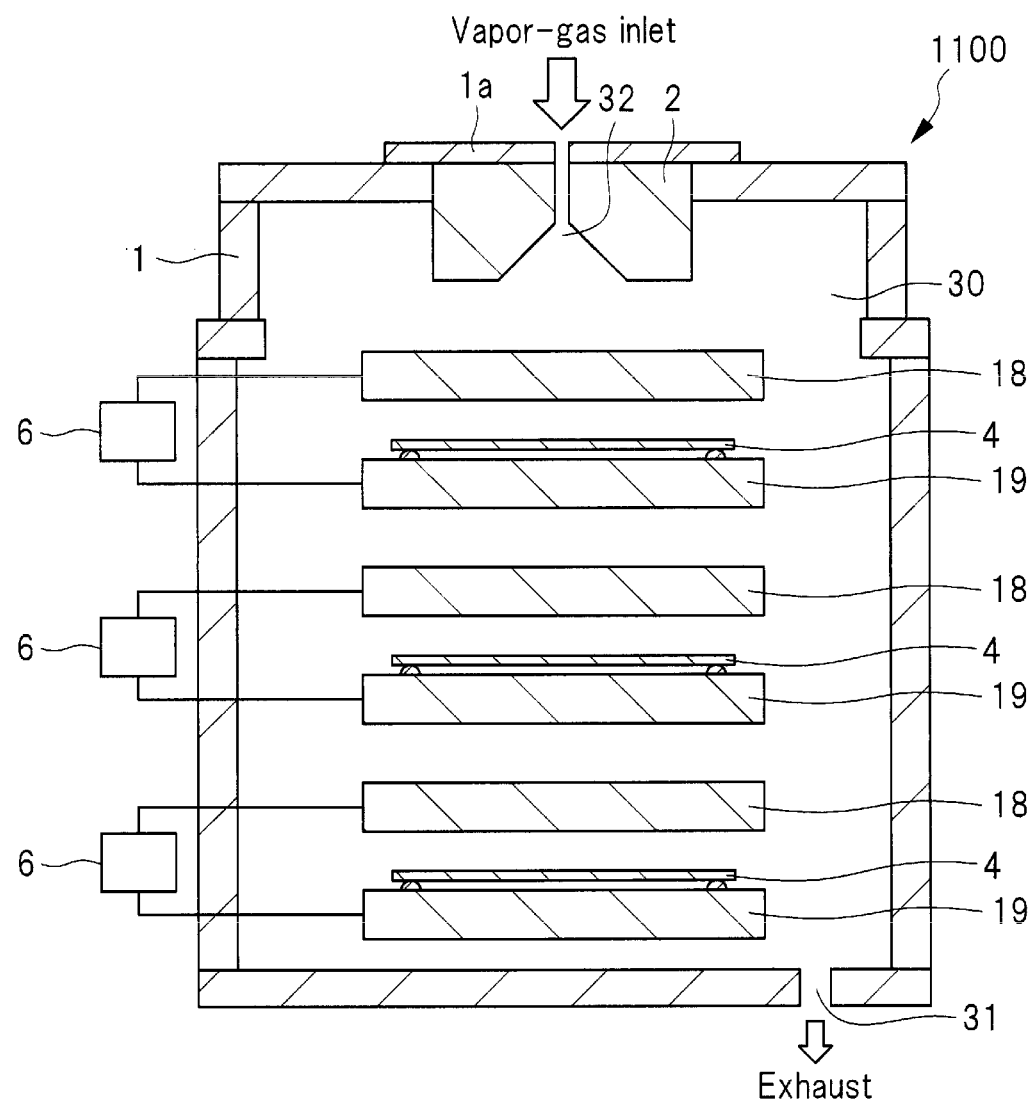
[FIG. 14]

[FIG. 15]
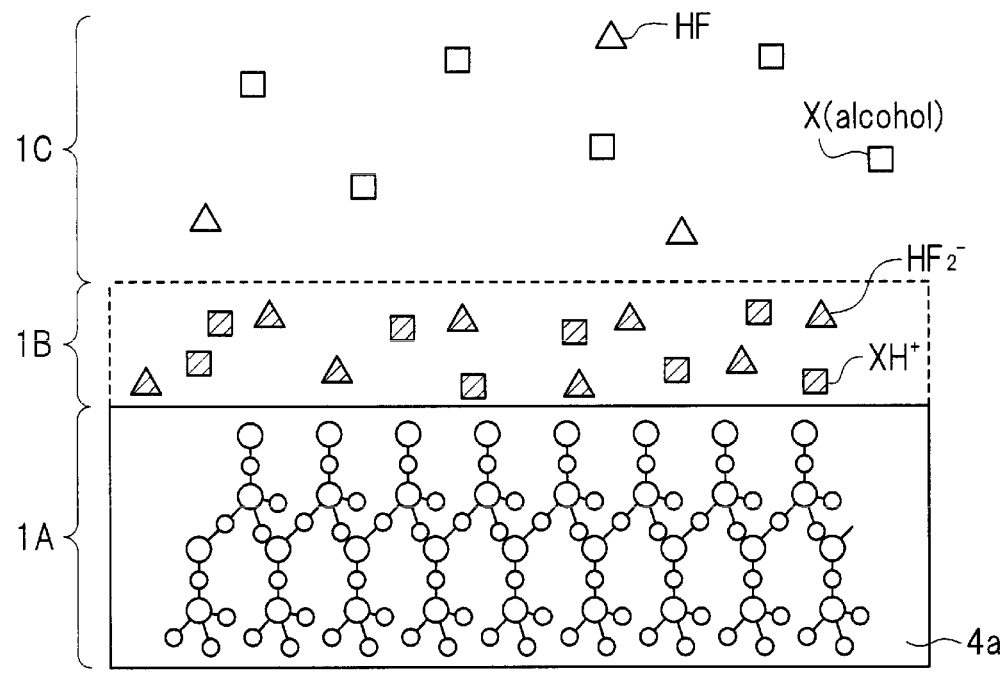

SEMICONDUCTOR MANUFACTURING APPARATUS AND SEMICONDUCTOR MANUFACTURING METHOD

TECHNICAL FIELD

The present invention relates to a semiconductor manufacturing apparatus and a semiconductor manufacturing method, and more particularly to a vapor etching apparatus that does not use plasma and a manufacturing method using the same.

BACKGROUND ART

In manufacture of a semiconductor device including a step of processing a film (for example, a silicon oxide ($SiO_2$) film) provided on a sample of a semiconductor wafer to form a circuit structure, with miniaturization of the semiconductor device, a need for a higher-accuracy processing technique is increasing. In recent years, as a processing apparatus for processing the $SiO_2$ film, a so-called vapor etching apparatus that does not use plasma and supplies, as a processing gas, a vapor of a specific substance to a surface of the $SiO_2$ film to react atoms or molecules of the substance with the $SiO_2$ film have been developed.

For example, in vapor-etching the $SiO_2$ film, etching using a mixed gas of hydrofluoric acid (HF) and an alcohol has been proposed as described in Non-PTL 1. In addition, PTL 1 (JP-A-2005-161493) also proposes a vapor etching apparatus using a mixed gas of HF and an alcohol.

CITATION LIST

Patent Literature

PTL 1: JP-A-2005-161493

Non-Patent Literature

Non-PTL 1: Chun Su Lee et al., "Modeling and Characterization of Gas-Phase Etching of Thermal Oxide and TEOS Oxide Using Anthdrous HF and $CH_3OH$", J. Electrochem. Soc., vol. 143, No. 3 pp. 1099-1103 (1996)

SUMMARY OF INVENTION

Technical Problem

It has been found that in etching using a vapor of a mixed gas of HF and an alcohol, it is effective to maintain a temperature of a wafer in an appropriate range during etching so as to keep an etching speed (rate) within a desired range. In addition, a pressure in a processing chamber can be mentioned as another parameter that influences the etching rate. However, parameters such as the temperature and the pressure in the processing chamber are generally difficult to change at a high speed. Therefore, in the related art, in vapor etching, in which a mixed gas is supplied as a vapor and etching is performed on $SiO_2$, so-called continuous etching, in which an etching amount monotonically increases with the passage of time, is applied.

Meanwhile, in the processing of semiconductor devices in recent years, high-accuracy etching is required, and for example, there is an increasing need for so-called atomic layer etching (ALE), which etches $SiO_2$ at an atomic layer level. For such an ALE problem for $SiO_2$, in the technique described in PTL 1, the etching amount per unit time (etching rate) cannot be adjusted to a value within a desired range with high accuracy, which may cause a problem that a processing yield is impaired.

An object of the invention is to provide a semiconductor manufacturing apparatus and a semiconductor manufacturing method capable of etching a film containing $SiO_2$ with high accuracy and improving the processing yield particularly in etching at an atomic layer level.

Other objects and novel characteristics will be apparent from the description of the present description and the accompanying drawings.

Solution to Problem

The typical ones of the embodiments disclosed in the present application will be briefly described as follows.

A semiconductor manufacturing apparatus-method according to typical embodiments includes arranging a wafer to be processed on an upper surface of which a first film containing silicon oxide is formed on an upper surface of a sample table arranged in a processing chamber inside a processing vessel, supplying a processing gas containing respective vapors of hydrogen fluoride and an alcohol into the processing chamber to generate a first layer in a liquid phase on the surface of the first film, and supplying DC power to an electrode arranged inside the sample table to form an electric field in the first layer for etching the first film without using plasma by attracting charged particles which are contained in the first layer and capable of contributing the etching of the first film toward a lower surface of the first layer, and repulsing other particles toward an upper surface of the first layer.

Advantageous Effect

According to the typical embodiments, the performance of the semiconductor manufacturing apparatus can be improved. In particular, high-accuracy etching for $SiO_2$ is possible.

BRIEF DESCRIPTION OF DRAWINGS

FIG. 1 is a vertical cross-sectional view schematically showing a configuration of an etching apparatus which is a semiconductor manufacturing apparatus according to an embodiment of the invention.

FIG. 2 is a block diagram schematically showing an overall configuration of the etching apparatus shown in FIG. 1 as a diagram in which blocks each showing a function are connected to each other.

FIG. 3 is a schematic view showing a configuration of an upper surface of a wafer and an inside of a processing chamber above the upper surface of the wafer during an etching processing using the etching apparatus shown in FIG. 1.

FIG. 4 is a schematic view showing a configuration of the upper surface of the wafer and the inside of the processing chamber above the upper surface of the wafer during the etching processing using the etching apparatus shown in FIG. 1.

FIG. 5 is a graph showing a relationship between a time and an etching amount in the etching processing.

FIG. 6 is a graph showing a relationship between the time and the etching amount in the etching processing using the etching apparatus shown in FIG. 1.

FIG. 7 is a vertical cross-sectional view schematically showing a configuration of an etching apparatus which is a semiconductor manufacturing apparatus according to Modification 1 of the embodiment of the invention.

FIG. 8 is a plan view showing a sample table constituting the etching apparatus shown in FIG. 7.

FIG. 9 is a graph schematically showing a change in an etching rate for a SiO$_2$ film on an upper surface of a wafer processed by using the etching apparatus which is the semiconductor manufacturing apparatus according to this modification shown in FIG. 7 with respect to a position in a radial direction of the wafer.

FIG. 10 is a vertical cross-sectional view schematically showing a configuration of an etching apparatus which is a semiconductor manufacturing apparatus according to Modification 2 of the embodiment of the invention.

FIG. 11 is a plan view showing a sample table constituting the etching apparatus shown in FIG. 10.

FIG. 12 is a graph schematically showing a change in an etching rate for a SiO$_2$ film on an upper surface of a wafer processed by using the etching apparatus which is the semiconductor manufacturing apparatus according to this modification shown in FIG. 10 with respect to a position in a radial direction of the wafer.

FIG. 13 is a vertical cross-sectional view schematically showing a configuration of an etching apparatus which is a semiconductor manufacturing apparatus according to Modification 3 of the embodiment of the invention.

FIG. 14 is a vertical cross-sectional view schematically showing a configuration of the etching apparatus which is the semiconductor manufacturing apparatus according to Modification 3 of the embodiment of the invention.

FIG. 15 is a schematic view showing a configuration of an upper surface of a wafer and an inside of a processing chamber above the upper surface of the wafer during an etching processing using an etching apparatus in a comparative example.

DESCRIPTION OF EMBODIMENTS

Hereinafter, embodiments of the invention will be described in detail with reference to the drawings. In all the drawings for describing the embodiments, members having same functions are denoted by same reference numerals, and repetitive description thereof will be omitted. In addition, in the embodiments, description of the same or similar parts will not be repeated in principle unless particularly necessary.

EMBODIMENTS

An etching apparatus and an etching method for etching a SiO$_2$ film, which is a film to be processed and previously formed on an upper surface of a semiconductor wafer (hereinafter, simply referred to as a wafer), will be described below as a step of manufacturing a semiconductor device. In this etching apparatus and etching method, so-called vapor etching is performed by supplying a vapor containing hydrogen fluoride (HF, hydrofluoric acid) and an alcohol X (CxHyOH) as a substance constituting a processing mixed gas to perform an etching processing. The present embodiment provides a semiconductor manufacturing apparatus or a semiconductor manufacturing method capable of adjusting an etching speed (rate) of SiO$_2$ with high accuracy.

<Details of Room for Improvement>

As a processing for processing a SiO$_2$ film, there is a so-called vapor etching method that does not use plasma and supplies, as a processing gas, a vapor of a specific substance to a surface of the SiO$_2$ film to react atoms or molecules of the substance with SiO$_2$.

For example, it is considered that in vapor etching for SiO$_2$, etching using a mixed gas of HF and an alcohol is performed. In vapor etching using HF and an alcohol, HF and the alcohol X mixed in a gas phase are liquefied on a wafer surface. In the liquid phase on the wafer surface, HF and the alcohol X are respectively ionized into a negative ion HF$_2^-$ and a positive ion XH$^+$, as represented by the following Formula 1.

$$2HF + X \rightarrow HF_2^- + XH^+ \quad (1)$$

Meanwhile, at an interface between the liquid phase and the SiO$_2$ film to be etched, the HF$_2^-$ which is a negative ion breaks a bond between a silicon atom (Si) and an oxygen atom (O) of SiO$_2$ and produces silicon tetrafluoride (SiF$_4$) and water (H$_2$O). This chemical reaction requires a proton (H$^+$), which is supplied by XH$^+$ in the liquid phase. As a result, a reaction represented by the following Formula 2 proceeds at the interface.

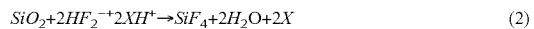

$$SiO_2 + 2HF_2^- + 2XH^+ \rightarrow SiF_4 + 2H_2O + 2X \quad (2)$$

When the above reaction is summarized, the reaction formula of the following Formula 3 is obtained.

$$SiO_2 + 4HF + 2X \rightarrow SiF_4 + H_2O + 2X \quad (3)$$

If reaction products such as SiF$_4$ and H$_2$O are continuously exhausted by a vacuum pump or the like, the reaction from the left side to the right side in Formula 3 proceeds in one direction, and as a result, the etching for SiO$_2$ proceeds. In order to carry out this reaction in a vacuum vessel, it is necessary to carry out etching at a saturated vapor pressure or lower of SiF$_4$ or H$_2$O or the like. However, in order to efficiently proceeding the reaction in Formula 1, a pressure in a processing chamber is preferably a pressure near the saturated vapor of HF or the alcohol X. For example, when etching is carried out under a pressure of several tens to several hundreds of Pa, efficient etching becomes possible.

In etching using a vapor of a mixed gas of HF and the alcohol X, it is effective to maintain a temperature of a wafer in an appropriate range during etching so as to keep an etching speed (rate) within a desired range. For example, with the wafer placed on a sample table arranged in the processing chamber, by setting a temperature of the sample table to an appropriately low value, a proportion at which particles of the vapor of HF or the alcohol X or the like adhere to the wafer (adhesion coefficient) increases. Accordingly, among vapors of substances supplied into the chamber above the wafer surface, some of the vapors that adhere to the wafer surface bind to each other to form droplets, and a layer of liquid (liquid phase) composed of the above-mentioned components is formed on the wafer surface.

This state is shown in FIG. 15. FIG. 15 is a schematic view showing a configuration of an upper surface of the wafer and an inside of the processing chamber above the upper surface of the wafer during an etching processing using an etching apparatus in a comparative example. In FIG. 15, hydrogen fluoride (HF) in a gas phase state is indicated by a white triangle, and the alcohol X in a gas phase state is indicated by a white square; a negative ion HF$_2^-$ in a liquid phase state is indicated by a hatched triangle, and a positive ion XH$^+$ in a liquid phase state is indicated by a hatched square.

As shown in FIG. 15, in a region 1A, a silicon oxide (SiO$_2$) film is previously formed on the wafer surface. In addition, a vapor containing hydrogen fluoride (HF) and the alcohol X is supplied into a chamber on a $SiO_2$ film 4a; in a region 1B on an upper surface of the $SiO_2$ film 4a, there is a liquid phase layer in which these substances (hydrogen fluoride and the alcohol) form a layer as a liquid phase; in a region 1C in a chamber on the liquid phase layer, there is a gas phase layer in which these substances (hydrogen fluoride and the alcohol) become vapors in a gas phase state. In this state, the total number of the negative ion $HF_2^-$, which is an etchant in the liquid phase layer in contact with the $SiO_2$ film 4a, is larger than that in the gas phase layer, and as a result, the etching speed (rate) for $SiO_2$ is increased.

In this state, a pressure in the processing chamber can be mentioned as another parameter that influences the etching rate. By increasing the pressure in the processing chamber to which the HF vapor is supplied, it is possible to increase a generation rate of $HF_2^-$. However, when processing conditions change, it is difficult to change values of parameters such as the temperature and the pressure in a short time according to the change, that is, to respond the change at a high speed. Therefore, it is considered that in vapor etching in which a mixed gas is supplied as a vapor and etching is performed on $SiO_2$, so-called continuous etching, in which an etching amount monotonically increases with the passage of time, is applied.

Meanwhile, in so-called atomic layer etching (ALE), in which $SiO_2$ is etched at an atomic layer level, when etching is performed using the mixed gas of HF and an alcohol as described in PTL 1, the etching amount per unit time (etching rate) cannot be adjusted to a value within a desired range with high accuracy, and a processing yield is impaired.

Thus, there is a room for improvement that in vapor etching without using plasma, a film containing $SiO_2$ cannot be etched with high accuracy, and especially in the etching at the atomic layer level, it is difficult to improve the processing yield.

<Structure of Etching Apparatus of Present Embodiment>

The present embodiment will be described below with reference to FIGS. 1 to 6. FIG. 1 is a vertical cross-sectional view schematically showing an outline of a configuration of the etching apparatus which is the semiconductor manufacturing apparatus according to the present embodiment. In particular, FIG. 1 shows an etching apparatus that etches $SiO_2$ by applying a DC electric field to a wafer.

As shown in FIG. 1, an etching apparatus 100 of the present embodiment includes a processing chamber 30, which is a space where a pressure is reduced inside a vacuum vessel (processing vessel) 1, and an electrode 5 which is a sample table (stage) arranged in the processing chamber 30 and on which a wafer 4 is placed above an upper surface. When the wafer 4 is placed on the electrode 5, the electrode 5 and the wafer 4 are in physical contact with each other. The vacuum vessel 1 having a cylindrical shape at least in part includes a circular top plate 1a, which is a lid member that airtightly seals the inside of the vacuum vessel 1 at an upper portion thereof, and a gas introduction portion 2 below the top plate 1a and above the processing chamber. The gas introduction portion 2 including a gas introduction hole 32 which is a gas path penetrating the top plate 1a and the gas introduction portion 2 in a vertical direction is included. At least a part of the vacuum vessel 1 described herein is a portion of the vacuum vessel 1 that surrounds the processing chamber 30 above the electrode 5 in a plan view.

A mixed gas containing HF and the alcohol X is introduced as a processing gas into the processing chamber 30. The alcohol X as used in the present application refers to a general substance represented by the chemical formula CxHyOH in which hydrogen atoms of a hydrocarbon are replaced with a hydroxy group, which is represented by isopropanol, ethanol, methanol, etc.

Further, an exhaust port 31, which is a through hole for discharging particles of gas or reaction products in the processing chamber 30 to the outside of the processing chamber 30, is arranged at a lower portion of the vacuum vessel 1 so as to communicate with the inside and outside of the processing chamber 30. A vacuum exhaust pump such as a turbo molecular pump or a rotary pump, which is communicating with an outlet of the exhaust port 31 via a pipe, is provided below the exhaust port 31. The inside of the processing chamber 30 is exhausted and depressurized by an operation of the vacuum exhaust pump.

In a lower portion of the processing chamber 30 having a cylindrical shape at least in part, the electrode 5 arranged at a center portion has a cylindrical shape when viewed from above. The electrode 5 includes a member made of a disc or cylindrical conductor such as a metal therein. A DC voltage source 6 is electrically connected to the member having electrical conductivity. The DC voltage source 6 is preferably a so-called bipolar power supply in which a function or polarity switcher capable of switching a polarity of a DC voltage in provided terminals is embedded, but is not limited to this.

In addition, here, at least one infrared lamp (IR lamp) unit 3 arranged in a ring shape above the processing chamber 30 and surrounding the gas introduction portion 2 on an outer peripheral side of the gas introduction portion 2 is provided inside the vacuum vessel 1. The infrared lamp unit 3 has a ring-shaped space arranged around the gas introduction hole 32 and a center of the electrode 5 when viewed from above the vacuum vessel 1. In addition, the infrared lamp unit 3 includes at least one infrared lamp 3a concentrically or spirally arranged in multiplication around a vertical axis of the gas introduction hole 32 or the electrode 5 having a cylindrical shape inside the space. Further, the infrared lamp unit 3 includes a ring-shaped window member 3b that is arranged between the infrared lamp 3a and the processing chamber 30 to forma ceiling surface of the processing chamber 30 and is made of a member such as quartz that transmits infrared rays emitted from the infrared lamp 3a. Furthermore, the infrared lamp unit 3 includes a cylindrical partition that surrounds the gas introduction portion 2 above an inner peripheral edge portion of the window member 3b, and a reflector (not shown) which is arranged above the infrared lamp 3a inside the above-mentioned ring-shaped space and reflects infrared rays emitted from the lower infrared lamp 3a toward the inside of the processing chamber 30 at a lower portion.

The infrared lamp 3a is electrically connected to a DC power supply (not shown) to be powered, and accordingly, by applying the infrared rays emitted from the infrared lamp 3a to the wafer 4, residues and reaction products on the wafer 4 are removed by heating by radiation. That is, the infrared lamp 3a is used to remove the residues and reaction products on the wafer 4 after the wafer 4 is etched by the etching apparatus 100.

A film made of $SiO_2$, which is a material to be etched, is formed in contact with an upper surface of the wafer 4. In addition, in the etching for $SiO_2$ in the present embodiment, the wafer 4 is irradiated by the infrared lamp 3a for the purpose of removing the reaction products, but the infrared lamp is not an essential component in the etching method here.

The etching apparatus 100 of the present embodiment is a vapor etching apparatus that supplies, as a processing gas, a vapor of a specific substance to a surface of a $SiO_2$ film to react atoms or molecules of the substance with the $SiO_2$ film, and does not use plasma during etching. That is, the etching apparatus 100 does not perform plasma etching. In other words, the etching apparatus 100 does not include a plasma generator (plasma generating unit).

Next, a step in which the etching apparatus 100 shown in FIG. 1 etches the wafer 4 on which a film containing $SiO_2$ is previously formed on the upper surface will be described. In the present embodiment, a mixed gas containing vapors of hydrogen fluoride (HF) and methanol ($CH_3OH$) is supplied as a processing gas into the processing chamber 30. The flow rates of HF and $CH_3OH$ are respectively adjusted to 500 mL/min and 250 mL/min. Further, by balancing an amount or speed of introducing the processing gas through the gas introduction portion 2 into the processing chamber 30 and an amount or speed of exhausting the processing gas from the processing chamber 30 adjusted by the operation of the vacuum exhaust pump, the pressure in the processing chamber 30 is adjusted to a value of 10 Pa to 1000 Pa.

The electrode 5 includes a refrigerant flow path (not shown) internally connected to a chiller for controlling a temperature of a refrigerant. Before and during processing of the wafer 4, temperatures of the electrode 5 and the wafer 4 held above an upper surface of the electrode 5 are each adjusted to a value of −50° C. to −10° C. by an action of the refrigerant being supplied from the chiller and circulating inside the refrigerant flow path. An optimum processing temperature of the wafer 4 depends on a pressure value in the processing chamber 30. As described above, a conductive member connected to the DC voltage source 6 which is a bipolar power supply is arranged as an electrode inside the electrode 5, and a voltage $V_{DC}=\pm 200$ V is applied to the conductive member during the processing of the wafer 4.

On the upper surface of the wafer 4 made of silicon (Si), as the film to be processed (material to be etched), a film containing $SiO_2$ is formed with a thickness of a value within a predetermined error range including 500 nm. The film is a thermal oxide film. The present inventor has detected the etching speed (rate) when such a wafer 4 is used and a mixed gas containing vapors of HF and $CH_3OH$ is supplied to the inside of the processing chamber 30 to etch the $SiO_2$ film. In the detection of the etching rate of the wafer 4, the present inventor has calculated the etching rate for the $SiO_2$ film as an average value of values detected at five locations at the center of the wafer 4 and in the vicinity thereof.

The detected etching rate for $SiO_2$ is 60 nm/min when $V_{DC}=0$ V. Meanwhile, when $V_{DC}=+200$V, the etching rate for $SiO_2$ increases to about 80 nm/min, whereas when $V_{DC}=+200$V, the etching rate for $SiO_2$ decreases to about 50 nm/min. In addition, if a bias voltage can be further increased, an effect of increasing and decreasing the etching rate is expected to increase.

An overall configuration including a configuration of the etching apparatus 100 of the present embodiment for supplying and exhausting the processing gas will be described with reference to FIG. 2. FIG. 2 is a block diagram schematically showing the overall configuration of the etching apparatus shown in FIG. 1 as a diagram in which blocks each showing a function are connected to each other. In FIG. 2, the illustration of a part of the configuration shown in FIG. 1 and the like is omitted.

As shown in FIG. 2, the etching apparatus of the present embodiment includes a hydrogen fluoride (HF) supply device 20 for supplying a vapor as a processing gas and a flow rate regulator 21 for the HF supply device 20. The HF supply device has a configuration in which HF is supplied in a high-pressure gas state by a storage portion such as a tank in which HF is stored and a commonly used cylinder. A mass flow controller for gas is widely used as the flow rate regulator 21.

In addition, the etching apparatus of the present embodiment has an alcohol X supply device 22 and a flow rate regulator 23. As the alcohol X supply device 22, a device that supplies the alcohol X by an alcohol X storage portion and a forcible vaporization method or in a liquid state is used. In addition, as the flow rate regulator 23, for example, a device having the same configuration as that of the flow rate regulator 21 is used.

After flow rates of gases from the supply devices 20 and 22 are adjusted by the flow rate regulators 21 and 23 in the paths through which HF and the alcohol X flow respectively, these paths merge as one flow path and are connected to the vacuum vessel 1 to supply the processing gas as a vapor into the internal processing chamber 30. However, a configuration for supplying the above-mentioned processing gas is not limited to the configuration described above using FIG. 2.

The etching apparatus of the present embodiment includes a vacuum vessel 24 and a vacuum exhaust pump 25 connected to and communicated with the exhaust port 31. The vacuum vessel 24 corresponds to the vacuum vessel 1 shown in FIG. 1. The supply device 20 is connected to the vacuum vessel 24 via the flow rate regulator 21 and the supply device 22 is connected to the vacuum vessel 24 via the flow rate regulator 23, and the vacuum vessel 24 is connected to the vacuum exhaust pump 25.

The vacuum vessel 24 is connected to a chiller 26 that supplies and circulates a refrigerant having a temperature within a predetermined range to a refrigerant flow path arranged inside the electrode 5. Here, the refrigerant from the chiller 26 is supplied to the refrigerant flow path in a state where the wafer 4 is placed and held on the upper surface of the electrode 5 or during the processing of the wafer 4. Accordingly, the temperature of each of the electrode 5 and the wafer 4 held on the electrode 5 is cooled to a temperature within a range suitable for processing. By cooling in this way, an adhesion rate of the mixed gas can be increased.

In addition, a DC power supply 28 having a polarity determining circuit is connected to the electrode 5 provided in the vacuum vessel 24 via a controller (DC power supply controller, control unit) 27. The controller 27 can control a polarity of a voltage applied from the DC power supply 28 to the electrode 5.

Configurations of the above-mentioned processing gas supply device, flow rate regulator, exhaust pump, or temperature regulator of the sample table supporting the wafer 4 and the like are also provided in an apparatus in each modification described later.

Next, a configuration of the upper surface of the wafer 4 during the etching processing for the $SiO_2$ film carried out in the present embodiment will be described with reference to FIGS. 3 and 4. FIGS. 3 and 4 are schematic views showing a configuration of the upper surface of the wafer and the inside of the processing chamber above the upper surface of the wafer during the etching processing using the etching apparatus shown in FIG. 1. As described with reference to FIG. 15, HF and the alcohol X supplied as a vapor into the processing chamber 30 form a liquid phase layer on the upper surface of the $SiO_2$ film on the wafer 4, and inside the liquid phase layer, HF and the alcohol X are separately ionized into positive ions and negative ions to form the negative ion $HF_2^-$, which is an etchant for $SiO_2$.

FIG. 3 shows a state of the upper surface of the wafer 4 when a polarity of a terminal of the DC voltage source 6 electrically connected to the conductive member in the electrode 5 is set to make polarities of the member and the electrode 5 positive. On a right side of FIG. 3, a direction of an electric field is indicated by a large arrow. In FIG. 3, by a positive electric field formed by applying a voltage to the conductive member in the electrode 5 (distribution of a difference of potentials which are higher on the electrode 5 side and lower on the inside of the processing chamber 30 above the wafer 4), an attractive force which is toward the lower electrode 5 acts on the negative ion $HF_2^-$, and the negative ion $HF_2^-$ moves downward in the liquid phase layer so as to approach the upper surface of the $SiO_2$ film 4a on the wafer 4.

Meanwhile, a repulsive force which moves away from the electrode 5 acts on the positive ion $XH^+$, and the positive ion $XH^+$ moves upward inside the liquid phase layer in a direction away from the upper surface of the $SiO_2$ film 4a on the wafer 4. That is, when an electric field supplied to the wafer 4 is applied in a positive direction (when a positive electric field in which a potential of the conductive member in the electrode 5 is relatively high is formed), the negative ion $HF_2^-$, which is an etchant, is segregated at an interface between the $SiO_2$ film 4a on the wafer 4 and the liquid phase layer above the $SiO_2$ film 4a. As a result, the etching rate for $SiO_2$ is increased as compared with the case where no electric field is applied.

Contrary to the example in FIG. 3, FIG. 4 shows a state of the upper surface of the wafer 4 when a polarity of a terminal of the DC voltage source 6 electrically connected to the conductive member in the electrode 5 is set to make polarities of the member and the electrode 5 negative. On a right side of FIG. 4, a direction of an electric field is indicated by a large arrow. As shown in FIG. 4, when an electric field formed on the upper surface of the wafer 4 is formed in a negative direction, a repulsive force acts on the negative ion $HF_2^-$ with respect to the electrode 5, and an attractive force acts on the $XH^+$ with respect to the electrode 5. That is, when an electric field is applied in a negative direction, the positive ion $XH^+$, which does not directly contribute to etching, is segregated at an interface between the upper surface of the $SiO_2$ film 4a on the wafer 4 and a lower surface of the liquid phase layer, and as a result, the etching rate for $SiO_2$ is expected to decrease as compared with the case where no electric field is applied.

<Effects of Present Embodiment>

The effects of the present embodiment will be described below with reference to FIGS. 5 and 6.

FIGS. 5 and 6 are graphs showing a relationship between a time and an etching amount in the etching processing. As shown in FIG. 5, it can be seen that when the voltage (bias voltage) $V_{DC}$ applied to the electrode 5 is positive ($V_{DC}>0$), the etching rate increases as compared with the case where $V_{DC}=0$. In contrast, it can be seen that when the bias voltage is negative ($V_{DC}<0$), the etching rate decreases. Here, a magnitude of the etching rate increases corresponding to a magnitude of the applied positive bias voltage.

Meanwhile, FIG. 6 shows a change in the etching amount of the $SiO_2$ film when the magnitude of the bias voltage is changed with the passage of time. For example, when the bias voltage is set to $V_{DC}=-V0$ (a negative constant value) at a time of $0<t<t1$, a progress of the etching for $SiO_2$ is prevented as described above. Next, when $V_{DC}=+V0$ (a positive constant value) is set at a time of $t1<t<t2$, the etching for $SiO_2$ proceeds. Thus, by temporally changing the bias voltage, it is possible to change the progress and prevention of etching. By utilizing this effect, highly accurate etching control for $SiO_2$ becomes possible. Therefore, the etching apparatus 100 of the present embodiment may include a control unit that changes the magnitude or polarity of the voltage of the DC power supplied to the electrode 5 according to the passage of time during the processing of the wafer 4.

Thus, in the present embodiment, in the etching apparatus that does not use plasma, the progress of etching can be controlled by controlling a voltage applied to the electrode in the sample table on which the wafer is provided. Accordingly, in vapor etching, a film containing $SiO_2$ can be etched with high accuracy. That is, the performance of the semiconductor manufacturing apparatus can be improved. In addition, especially in the etching at an atomic layer level, the processing yield can be improved. That is, the above-mentioned room for improvement can be eliminated.

<Modification 1>

Modification 1 of the present embodiment will be described with reference to FIG. 7. FIG. 7 is a vertical cross-sectional view schematically showing an outline of a configuration of an etching apparatus of this modification. FIG. 8 is a plan view showing a sample table constituting the etching apparatus shown in FIG. 7. An etching apparatus 600 of this modification is different from the etching apparatus 100 shown in FIG. 1 in that the sample table that holds the wafer 4 on the upper surface thereof includes electrodes which are a plurality of members made of conductors concentrically arranged in a radial direction of the cylindrical shape thereof. In the following description, regarding the components which are denoted by the same reference numerals as those in the embodiments described with reference to FIGS. 1 to 6, the description is omitted unless necessary.

Similar to the etching apparatus 100, the etching apparatus 600 of this modification includes the vacuum vessel 1, the processing chamber 30, the gas introduction portion 2 having the gas introduction hole 32, the infrared lamp unit 3, and the exhaust port 31 arranged on a bottom surface of the vacuum vessel 1. In this modification, a first multi-electrode 10 having a cylindrical shape or a disc shape arranged on the lower portion the processing chamber 30 below the gas introduction hole 32 is included. The first multi-electrode 10 includes a plurality of members made of conductors arranged at locations or regions having different radial positions in the radial direction thereof. Each of the plurality of members made of conductors is electrically connected to the DC voltage source 6.

The plan view of the plurality of members made of conductors constituting the first multi-electrode 10 is shown in FIG. 8. FIG. 8 is a diagram schematically showing a configuration in which an upper surface or a cross section at a specific vertical height of the first multi-electrode 10 in FIG. 7 is viewed from above, and especially shows an arrangement of the plurality of members made of conductors. As shown in FIG. 8, the first multi-electrode 10 includes an inner electrode 7 made of a disc or cylindrical conductor and arranged in a center in a radial direction of the cylindrical or disc shape thereof, an outer electrode 8 made of a ring-shaped conductor and surrounding the inner electrode 7 at a distance from the inner electrode 7 on an outer peripheral side of the inner electrode 7, and a ring-shaped insulator 9 arranged between these two electrodes arranged at a distance in the radial direction and made of a dielectric material that electrically insulates these electrodes.

In the first multi-electrode 10, the insulator 9 is arranged so as to be sandwiched and fitted between the inner electrode 7 and the outer electrode 8 and is connected to the two electrodes. Further, the DC voltage source 6 in this example has one of the terminals being electrically connected to the inner electrode 7, and can apply a DC voltage to the inner electrode 7. In addition, the other terminal of the DC voltage source 6 is electrically connected to the outer electrode 8 together with a ground electrode (not shown) to be set to a ground potential. Accordingly, it is possible to change the potential of the inner electrode 7 connected to the one terminal of the DC voltage source 6, which is a bipolar power supply, between positive and negative. In addition, a relative magnitude of the potential of the inner electrode 7 with respect to that of the outer electrode 8 can be changed.

In this modification, the inner electrode 7, the outer electrode 8 and the insulator 9 preferably have a circular or cylindrical shape, and are preferably concentrically arranged. However, the shapes of the inner electrode 7, the outer electrode 8 and the insulator 9, and the shape of the first multi-electrode 10 including the inner electrode 7, the outer electrode 8 and the insulator 9 are not limited to the disc shape or the cylindrical shape.

Next, a step in which the etching apparatus 600 shown in FIGS. 7 and 8 etches the wafer 4 on which the film containing $SiO_2$ is previously formed on the upper surface will be described. In the etching apparatus 600 of this modification, conditions for processing the wafer 4 are the same as those used in the etching apparatus 100 which is the semiconductor manufacturing apparatus according to the embodiment shown in FIGS. 1 to 6.

A mixed gas containing vapors of HF and the alcohol X is supplied into the processing chamber 30 of the etching apparatus 600 of this modification, and in a state where the wafer 4 is arranged and held on the upper surface of the first multi-electrode 10 in the processing chamber 30, the $SiO_2$ film on the upper surface of the wafer 4 is etched while a voltage $V_{DC}=+200V$ or $-200$ V is applied from the DC voltage source 6, which is a bipolar power supply, to the inner electrode 7. Results of measuring the etching rate at 13 points on a 300 mm wafer in this case will be described.

In this modification, as shown in FIG. 8, a radius of the circular inner electrode 7 from the center of the first multi-electrode 10 viewed from above is set to r1=100 mm; a radius of an outer peripheral edge of the ring-shaped insulator 9 is set to r2=150 mm; a radius to an outer peripheral edge of the outer electrode 8 is set to r3=200 mm.

When the voltage applied to the inner electrode 7 is $V_{DC}=+200V$, the etching rate for the $SiO_2$ film is about 80 nm/min at the center of the wafer 4 placed and held on the upper surface of the first multi-electrode 10, whereas the etching rate is about 65 nm/min at an outer peripheral edge portion of the wafer 4. Meanwhile, when $V_{DC}=+200V$, the etching rate is about 50 nm/min at the center of the wafer 4 and about 55 nm/min at the edge portion. Similar to the above-mentioned embodiment, the etching rate for the $SiO_2$ film on the upper surface of the wafer 4 can be further increased or decreased by further increasing the bias voltage supplied to and formed on the first multi-electrode 10.

FIG. 9 is a graph schematically showing a change in the etching rate for the $SiO_2$ film on the upper surface of the wafer processed by using the etching apparatus which is the semiconductor manufacturing apparatus according to this modification shown in FIG. 7 with respect to a position in a radial direction of the wafer. Here, in FIG. 9, a position of the center of the wafer 4 is represented as 0, and radial positions of the outer peripheral edges of the inner electrode 7, the insulator 9, and the outer electrode 8 are respectively represented as r2, r2', and rG.

When the bias voltage supplied to the inner electrode 7 is $V_{DC}>0$, in the liquid phase layer formed of mixed gas particles on the $SiO_2$ film on the inner electrode 7 located in the range of $-r2<r<+r2$ of a radial position shown on a horizontal axis, a segregation amount of $HF_2^-$ increases. Therefore, the etching rate is relatively increased as compared with the case where $V_{DC}\leq0$. Meanwhile, on the upper surface of the $SiO_2$ film above the outer electrode 8 located at radial positions $r2'<r<rG$, $-rG<r<-r2'$ which is set to a ground potential, a DC bias voltage=0, and thus, the etching rate is reduced as compared with the etching rate on the inner electrode 7. As a result, as shown in the graph shown by a solid line in FIG. 9, a distribution of the etching rate for the $SiO_2$ film on the wafer 4 is a so-called mountain-shaped distribution centered on a coordinate O on the horizontal axis, which is large at the center of the wafer 4 and small at a peripheral edge portion.

Meanwhile, as shown in the graph shown by an alternate long and short dash line in FIG. 9, contrary to the above-mentioned case of $V_{DC}\leq0$, the distribution of the etching rate when the bias voltage is $V_{DC}\leq0$ shows a valley-shaped rate distribution in which the etching rate in the center is lower than the etching rate on the $SiO_2$ film on the outer electrode 8. Therefore, according to this modification, by variably adjusting a value of a voltage applied to the inner electrode 7 to a plurality of values between positive and negative values, the etching rate can be realized in a flexible shape between a mountain shape and a valley shape. In addition, when a radius of the wafer 4 is larger than that of the inner electrode 7, it is possible to effectively adjust a distribution including the magnitude of the etching rate, especially at the outer peripheral edge portion of the wafer 4, and a ratio to the value of the rate at the center portion.

<Modification 2>

Modification 2 of the present embodiment will be described with reference to FIGS. 10 and 11. FIG. 10 is a vertical cross-sectional view schematically showing an outline of a configuration of an etching apparatus of this modification. FIG. 11 is a plan view showing a sample table constituting the etching apparatus shown in FIG. 10. As shown in FIGS. 10 and 11, an etching apparatus 800 of this modification is different from the etching apparatus shown in FIGS. 1 and 7 in that the sample table that holds the wafer 4 on the upper surface thereof includes electrodes which are made of three or more members conductors concentrically arranged in a radial direction of the cylindrical shape thereof. In the following description, regarding the components which are denoted by the same reference numerals as those in the embodiments described with reference to FIGS. 1 to 6, the description is omitted unless necessary.

Similar to the etching apparatus 100 shown in FIG. 1 or the etching apparatus 600 shown in FIG. 7, the etching apparatus 800 of this modification includes the vacuum vessel 1, the gas introduction portion 2, the infrared lamp unit 3, and the exhaust port 31 arranged on the bottom surface of the vacuum vessel 1. Further, in this modification, a second multi-electrode 14 is included instead of the first multi-electrode 10 in FIG. 7. The second multi-electrode 14 includes a center electrode 11 having a disc or cylindrical shape electrically insulated from each other by a plurality of ring-shaped insulators 9. In addition, the second multi-electrode 14 includes a first intermediate electrode 12 and a second intermediate electrode 13 which are doubly arranged on an outer peripheral side of the center electrode 11 concentrically with a central axis of the center electrode and each have a ring shape. Further, the second multi-electrode 14 includes the outer electrode 8 which is arranged in a ring shape surrounding the first intermediate electrode 12 and the second intermediate electrode 13 on the outer peripheral sides and is electrically grounded.

The center electrode 11, the first intermediate electrode 12, and the second intermediate electrode 13 are electrically connected to different DC voltage sources 15, 16 and 17, respectively. That is, the center electrode 11 is connected to a terminal of the DC voltage source 15; the first intermediate electrode 12 is connected to a terminal of the DC voltage source 16; the second intermediate electrode 13 is connected to a terminal of the DC voltage source 17. Voltages adjusted each independently from the DC voltage sources 15, 16 and 17 are respectively applied to the center electrode 11, the first intermediate electrode 12 and the second intermediate electrode 13. Here, the second multi-electrode 14 shown in FIG. 10 includes four electrodes concentrically arranged in multiplication which are insulated from each other. However, the number of the electrodes is not limited to that in this modification, and the same action and effect as in this modification can be obtained as long as the number is 3 or more. In addition, these electrodes have a disc, cylindrical, or ring shape, but the shapes of the electrodes are not limited to those in this modification.

FIG. 12 is a graph schematically showing a change in an etching rate for a $SiO_2$ film on an upper surface of a wafer processed by using the etching apparatus which is the semiconductor manufacturing apparatus according to the modification shown in FIG. 10 with respect to a position in a radial direction of the wafer. In FIG. 12, a radial position r shown as a variable on the horizontal axis is represented as follows. That is, in FIG. 12, radial positions r of outer peripheral edges of the center electrode 11, the first intermediate electrode 12, the second intermediate electrode 13, and the outer electrode 8 are respectively set to r4, r5, r6, and rG, and radial positions of inner peripheral edges of the first intermediate electrode 12, the second intermediate electrode 13, and the outer electrode 8 (outer peripheral edges of the insulators 9) having a ring shape when viewed from above are set to r4', r5', and r6', respectively.

In this modification, for example, when voltages having values of $V_{DC}=+V4$, $V_{DC}=-V5$ and $V_{DC}=+V6$ are respectively applied from the DC voltage sources 15, 16 and 17 to the center electrode 11, the first intermediate electrode 12 and the second intermediate electrode 13, the segregation amount of etchant $HF_2^-$ in the liquid phase layer on the upper surface of the $SiO_2$ film on the wafer 4 increases or decreases according to a magnitude of an electric field (potential difference) formed by the applied bias voltage. Therefore, compared with the case of the outer electrode 8 in which a voltage is 0 (a potential is set to 0), a value is large at a location where the position r is smaller than r4, small at a location where the position r is at r4' to r5, and large at a location where the position r is at r5' to r6. Further, a location between these radial positions r ranges are above the insulator 9, and the above-mentioned voltage at the location is substantially proportional to a dielectric constant of a material constituting the insulator 9 and a potential difference between electrodes sandwiching the insulator 9. Therefore, also in FIG. 12, r increases or decreases linearly between r4 and r4', between r5 and r5', and between r6 and r6' on each of positive and negative sides with the coordinate 0 therebetween which is centered on the segregation amount.

In addition, when $|V4|>|V6|$, the segregation amount of $HF_2^-$ at a location on the center electrode 11 is larger than that at a location on the second intermediate electrode 13, and thus, the etching rate is higher than that at the center of the wafer 4. Thus, according to this modification, when the second multi-electrode 14 is divided into a plurality of radial ranges and each has a plurality of insulated electrodes, an etch rate distribution on a plane of the wafer 4 can be made desired one by adjusting voltages supplied to these electrodes and potentials formed by the voltages. However, when the number of the above-mentioned plurality of electrodes is increased and a range occupied by these electrodes in the radial direction is excessively subdivided, it is difficult to accurately realize a distribution of a concentration of the negative ion $HF_2^-$, and thus, it is appropriate that the number of electrodes is at most about several tens. By using this modification, for example, even if there is a difference in an etching rate distribution between an inner peripheral portion and an outer peripheral portion on a wafer surface, it is possible to control uniformity on the wafer surface.

<Modification 3>

Next, Modification 3 of the invention will be described with reference to FIG. 13. FIG. 13 is a vertical cross-sectional view schematically showing an outline of a configuration of an etching apparatus which is a semiconductor manufacturing apparatus according to this modification. In this modification, regarding the components which are denoted by the same reference numerals as those in the embodiments and modifications described with reference to FIGS. 1 to 12, the description is omitted unless necessary.

In FIG. 13, as a configuration feature of an etching apparatus 1000 which is a semiconductor manufacturing apparatus according to this modification, the etching apparatus 1000 includes a so-called pair of parallel flat plate type electrodes including an additional electrode plate such as the electrode 5, the first multi-electrode 10, or the second multi-electrode 14 in the processing chamber 30, which is arranged on the upper surface of the sample table on which the wafer 4 is placed so as to face the upper surface and be substantially parallel to the upper surface, which is different from the etching apparatus 100 in the example shown in FIG. 1, the etching apparatus 600 of Modification 1 shown in FIG. 7, and the etching apparatus 800 of Modification 2 shown in FIG. 10. That is, in this modification, an upper plate electrode 18 and a lower plate electrode 19 having a disc or cylindrical shape and arranged at positions where a lower surface and an upper surface are parallel or are arranged to the degree of being considered to be parallel with a predetermined gap above and below a position where central axes thereof in a vertical direction substantially match each other when viewed from above are provided in the processing chamber 30.

In this modification, these electrodes are configured to be electrically connected to different terminals of the DC voltage source 6 that are given different polarities such that a potential difference is formed between the electrodes. In this modification, the upper and lower electrodes need to form potentials at which a potential difference is formed therebetween, and the potential or polarity for this purpose is not limited to the modification described above.

The lower plate electrode 19 and the upper plate electrode 18 above the lower plate electrode 19 are provided in the processing chamber 30. The upper plate electrode 18 and the lower plate electrode 19 are located at locations of overlapping each other in a plan view.

When the wafer 4 is arranged on a flat upper surface of the lower plate electrode 19, and a potential formed on a lower surface of the upper plate electrode 18 by a DC power supplied to the upper plate electrode 18 is higher than a potential on the upper surface of the lower plate electrode 19, an electric field formed therebetween is directed downward so as to attract positively charged particles to the upper surface of the lower wafer 4, and the etching for the $SiO_2$ film formed on the surface of the wafer 4 proceeds. Meanwhile, on the contrary, when the potential of the lower surface of the upper plate electrode 18 is lower than that of the upper surface of the lower plate electrode 19, the electric field is directed upward and the etching for the SiO$_2$ film of the wafer 4 is prevented. Thus, according to this modification, by adjusting the potential or polarity formed by an electric power supplied to a set of parallel flat plate electrodes held on one surface of a wafer, or a magnitude of a potential difference between these parallel flat plate electrodes, the etching rate for the SiO$_2$ film on the surface of the wafer 4 can be adjusted within a desired range.

The pair of the parallel flat plate type electrodes arranged in the processing chamber 30 is not limited to one as shown in FIG. 13. For example, a plurality of pairs of the parallel flat plate type electrodes may be arranged in the vertical direction or the horizontal direction in one processing chamber 30 in the vacuum vessel 1. For example, similar to an etching apparatus 1100 shown in FIG. 14, a pair of parallel flat plate type electrodes having a plurality of pairs (three pairs in FIG. 14) of the upper plate electrodes 18 and the lower plate electrodes 19 and the DC voltage sources 6 electrically connected thereto may be provided inside the vacuum vessel 1 with a gap therebetween in the vertical direction.

FIG. 14 is a vertical cross-sectional view schematically showing a configuration of the etching apparatus which is the semiconductor manufacturing apparatus according to Modification 3 of the embodiment of the invention. In the modification shown in FIG. 14, the wafer 4 can be etched by a so-called batch method in which in a state where a plurality of the wafers 4 are stored in the processing chamber 30 and held on the upper surface of each of a plurality of the lower plate electrodes 19, SiO$_2$ films on the upper surfaces of the plurality of the wafers 4 are etched in parallel. The power supplied from each of the DC voltage sources 6 connected to these pair of the parallel flat plate type electrodes can be variably adjusted according to specifications such as different circuit patterns or SiO$_2$ films on the plurality of the wafers 4. Accordingly, by making conditions such as an electric field formed during the processing of the wafer 4 or a bias potential formed on the lower plate electrode 19 different, different etching rates can be realized for different wafers 4 in the batch method. Here, an optimum processed shape after processing required for each of the wafers 4 may be obtained under appropriate processing conditions.

The invention made by the present inventors has been specifically described above based on the embodiments, but the invention is not limited to the embodiments described above, and various changes and modifications may be made without departing from the scope of the invention.

INDUSTRIAL APPLICABILITY

The invention can be widely used in the semiconductor manufacturing apparatus and the semiconductor manufacturing method.

REFERENCE SIGN LIST 1 vacuum vessel
2 gas introduction portion
3 infrared lamp
4 wafer
5 electrode
6 DC voltage source

The invention claimed is:

1. A semiconductor manufacturing method comprising:
arranging a wafer to be processed on an upper surface of which a first film containing silicon oxide is formed on an upper surface of a sample table arranged in a processing chamber inside a processing vessel;
supplying a processing gas containing respective vapors of hydrogen fluoride and an alcohol into the processing chamber to generate a first layer in a liquid phase on a surface of the first film; and
supplying DC power to an electrode arranged inside the sample table to form an electric field in the first layer for etching the first film without using plasma by attracting charged particles which are contained in the first layer and capable of contributing the etching of the first film toward a lower surface of the first layer, and repulsing other particles toward an upper surface of the first layer.

2. The semiconductor manufacturing method according to claim 1, wherein
during the etching processing, periods during which the DC power is supplied to attract the charged particles which are capable of contributing the etching of the first film or a magnitude or polarity of a voltage of the DC power are changed according to the passage of time.

3. The semiconductor manufacturing method according to claim 2, wherein
the electrode includes a plurality of electrodes including an inner electrode arranged in a region on a center side of the sample table in a plan view and an outer electrode surrounding the inner electrode on an outer peripheral side of the inner electrode, and
one of the plurality of electrodes is connected to a ground electrode to be set to a ground potential.

4. The semiconductor manufacturing method according to claim 1, wherein
the electrode includes a plurality of electrodes including an inner electrode arranged in a region on a center side of the sample table in a plan view and an outer electrode surrounding the inner electrode on an outer peripheral side of the inner electrode, and
one of the plurality of electrodes is connected to a ground electrode to be set to a ground potential.

* * * * *